(12) United States Patent
Murakami et al.

(10) Patent No.: US 10,062,632 B2
(45) Date of Patent: Aug. 28, 2018

(54) SEMICONDUCTOR DEVICE HAVING IMPROVED HEAT DISSIPATION EFFICIENCY

(71) Applicant: Mitsubishi Electric Corporation, Tokyo (JP)

(72) Inventors: Haruhiko Murakami, Tokyo (JP); Rei Yoneyama, Tokyo (JP); Yoshitaka Kimura, Tokyo (JP); Takayuki Shirahama, Hyogo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 15/386,764

(22) Filed: Dec. 21, 2016

(65) Prior Publication Data

US 2017/0301603 A1    Oct. 19, 2017

(30) Foreign Application Priority Data

Apr. 19, 2016 (JP) .................. 2016-083444

(51) Int. Cl.
| | |
|---|---|
| *H01L 23/02* | (2006.01) |
| *H01L 23/36* | (2006.01) |
| *H01L 23/34* | (2006.01) |
| *H01L 23/367* | (2006.01) |
| *H01L 23/373* | (2006.01) |
| *H01L 23/00* | (2006.01) |

(52) U.S. Cl.
CPC ...... *H01L 23/3675* (2013.01); *H01L 23/3737* (2013.01); *H01L 24/49* (2013.01); *H01L 2224/48091* (2013.01)

(58) Field of Classification Search
CPC ... H01L 23/3675; H01L 23/367; H01L 23/36; H01L 23/34; H01L 23/02
USPC .................. 257/704, 680; 361/140, 142, 752
See application file for complete search history.

(56) References Cited

U.S. PATENT DOCUMENTS

| | | | | |
|---|---|---|---|---|
| 5,285,107 | A * | 2/1994 | Kazami | H01L 21/67121 257/678 |
| 2003/0063442 | A1* | 4/2003 | Kimoto | H02M 7/003 361/704 |
| 2014/0043757 | A1* | 2/2014 | Bernstein | H01L 23/38 361/689 |
| 2014/0146480 | A1* | 5/2014 | Ullo | E21B 47/011 361/719 |

FOREIGN PATENT DOCUMENTS

JP        2006-121861 A      5/2006

* cited by examiner

*Primary Examiner* — Marcos D Pizarro
*Assistant Examiner* — Antonio Crite
(74) *Attorney, Agent, or Firm* — Studebaker & Brackett PC

(57) ABSTRACT

A semiconductor device includes a base plate, a case, a power semiconductor element, and a control semiconductor element. Case is provided on base plate. Power semiconductor element is disposed over base plate in case. Control semiconductor element is disposed in case. Case has an opening formed therein opposite to base plate. The semiconductor device further includes a cover to close opening in case. Cover has a hole formed in at least a portion of a region overlapping control semiconductor element in plan view.

7 Claims, 9 Drawing Sheets

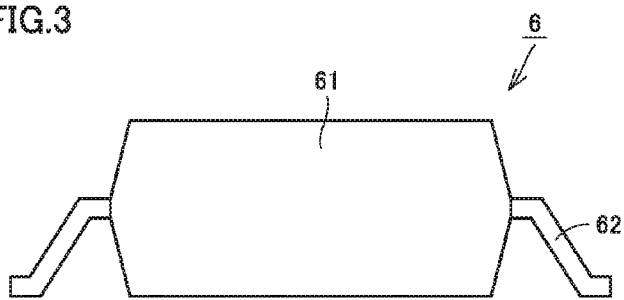
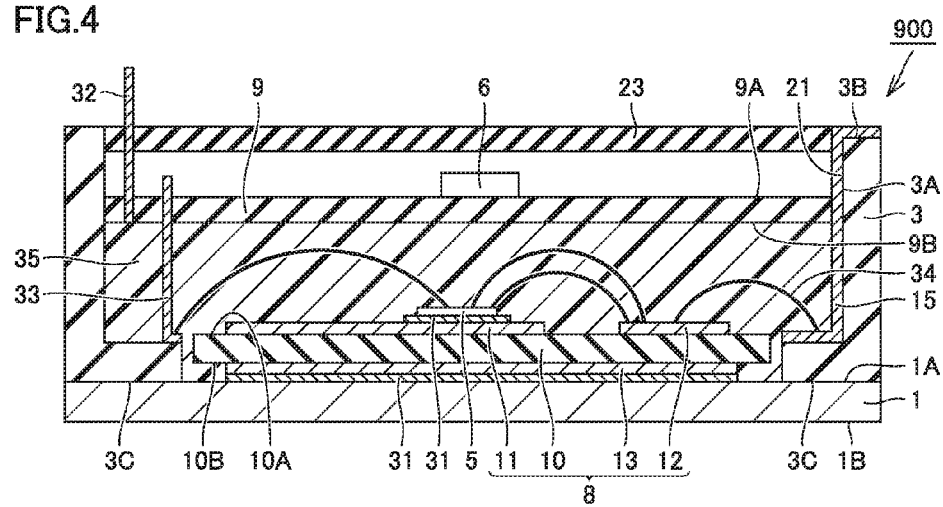

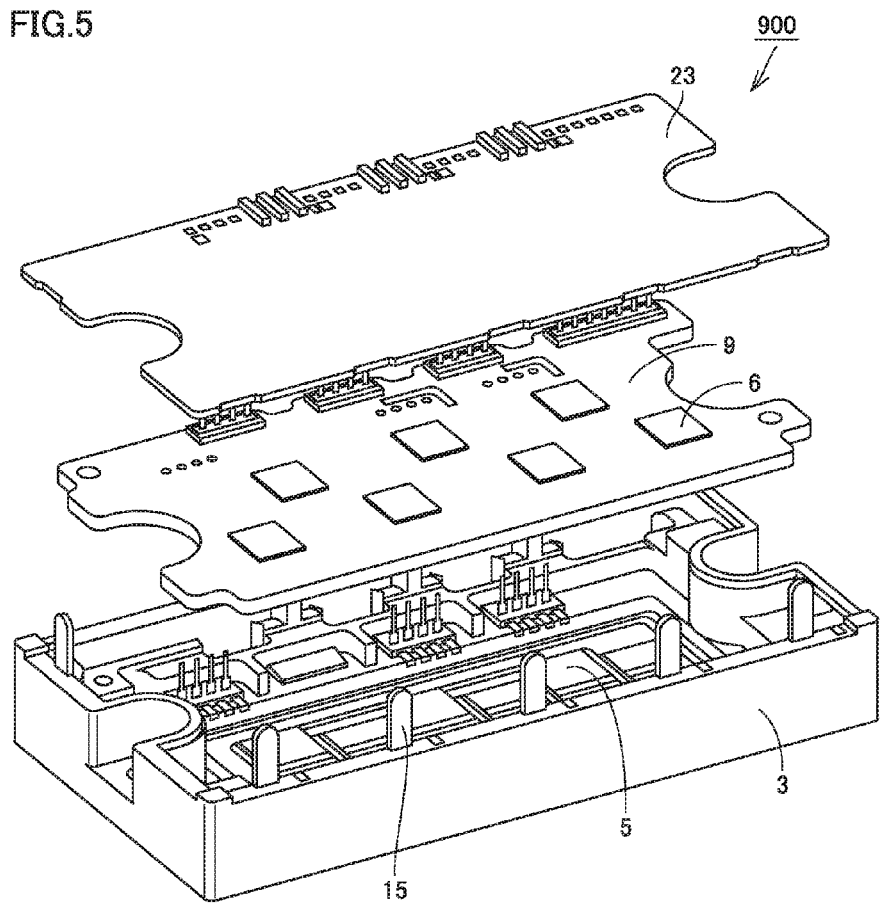

SEMICONDUCTOR DEVICE HAVING IMPROVED HEAT DISSIPATION EFFICIENCY

BACKGROUND OF THE INVENTION

Field of the Invention

The present invention relates to semiconductor devices, and more particularly to a semiconductor device having a configuration in which a power semiconductor element is sealed with resin.

Description of the Background Art

A semiconductor module for power control has a power semiconductor element used as a switching device, such as an IGBT (Insulated Gate Bipolar Transistor), a MOSFET (Metal Oxide Semiconductor Field Effect Transistor), or a FWDi (Free Wheeling Diode), incorporated in an enclosure. Such a semiconductor module is referred to as a power module.

In the field of power modules, there is a so-called intelligent power module (IPM) including not only a power semiconductor element but also a control circuit that drives and protects the power semiconductor element. A configuration such as disclosed in Japanese Patent Laying-Open No. 2006-121861, for example, is known as the intelligent power module.

SUMMARY OF THE INVENTION

In an intelligent power module, an internal part that generated heat needs to be cooled by heat dissipation or the like from the viewpoint of suppressing degradation of its performance. In Japanese Patent Laying-Open No. 2006-121861, however, a control circuit board serving as a board of a control circuit is sealed with insulating resin. It is thus difficult to cool electronic components such as a control semiconductor element mounted on this control circuit board.

The present invention has been made in view of the aforementioned problem, and an object of the invention is to provide a semiconductor device in which a control semiconductor element mounted on a control circuit board in an intelligent power module can be cooled at high efficiency.

A semiconductor device of the present invention includes a base plate, a case, a power semiconductor element, and a control semiconductor element. The case is provided on the base plate. The power semiconductor element is disposed over the base plate in the case. The control semiconductor element is disposed in the case. The case has an opening formed therein opposite to the base plate. The semiconductor device further includes a cover to close the opening in the case. The cover has a hole formed in at least a portion of a region overlapping the control semiconductor element in plan view.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 3 is a schematic front view illustrating the configuration of a control semiconductor element disposed in a region III enclosed by a dotted line in FIG. 1.

FIG. 4 is a schematic sectional view illustrating the configuration of a semiconductor device of a comparative example.

FIG. 5 is an exploded perspective view to illustrate the arrangement of members forming the semiconductor device of FIG. 4.

DESCRIPTION OF THE PREFERRED EMBODIMENTS

Embodiments will now be described with reference to the drawings.

First Embodiment

Figure 1:
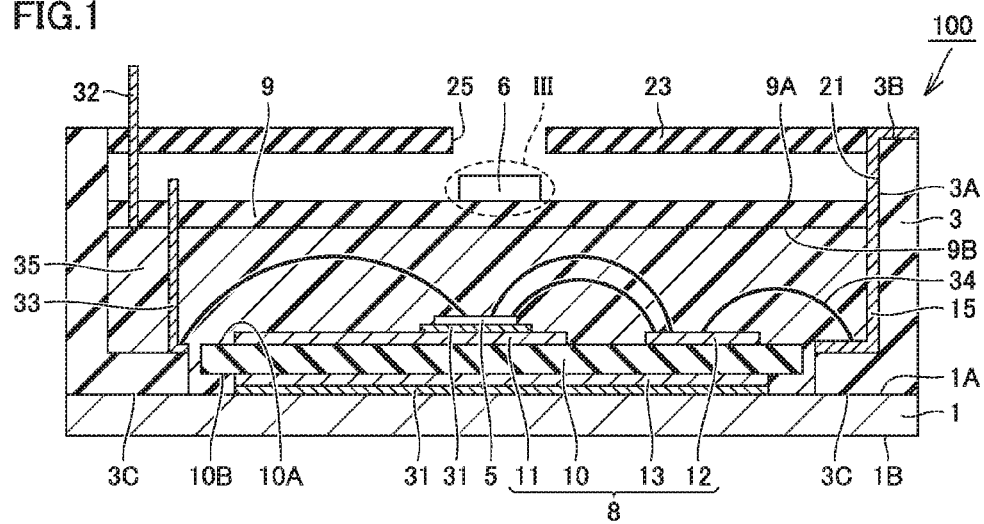
FIG. 1 is a schematic sectional view illustrating the configuration of a semiconductor device of a first embodiment.

First, with reference to FIG. 1, the configuration of a semiconductor device 100 of this embodiment is described. Referring to FIG. 1, semiconductor device 100 of this embodiment is an intelligent power module mainly including a base plate 1, a case 3, a power semiconductor element 5, and a control semiconductor element 6.

Base plate 1 is a member in the shape of a flat plate, for example, which is disposed at the bottom of the entire semiconductor device 100 and serves as a base of the entire semiconductor device 100. Base plate 1 has one main surface 1A and the other opposite main surface 1B having a rectangular shape in plan view, for example. The upper main surface in FIG. 1 of the pair of main surfaces of base plate 1 is herein referred to as one main surface 1A, while the lower main surface in FIG. 1 is referred to as the other main surface 1B. It is preferable that base plate 1 be made of a metal material such as aluminum.

Case 3 is a member having a rectangular frame shape, which is provided so as to be joined to base plate 1, that is, to one main surface 1A, and is disposed in a region corresponding in size to the outermost region of base plate 1 in plan view. That is, case 3 is disposed so as to surround a central portion of base plate 1 in plan view. When case 3 is attached onto and integrated with base plate 1, the shape of a container with base plate 1 as a bottom surface and case 3 as a side surface is formed. Members to be described later are mounted in this container-shaped member, that is, in a portion located on the central portion of base plate 1 and surrounded by case 3. Case 3 is made of an insulating material such as resin.

Case 3 has a case wall portion 3A, a case upper surface 3B, and a case lower surface 3C. Case wall portion 3A is a main portion of case 3, which extends in the vertical direction of FIG. 1 to form a portion surrounded by case 3, together with base plate 1, as a container-shaped housing portion. Case upper surface 3B is a surface of the top of case wall portion 3A. Case lower surface 3C is a surface of the bottom of case 3, and includes a portion joined to one main surface 1A of base plate 1. It is preferable that case 3 be formed such that the bottom including case lower surface 3C extends more inward in plan view in relation to case wall portion 3A and case upper surface 3B. This can increase the area of case lower surface 3C which is joined to one main surface 1A of base plate 1 as compared to when case lower surface 3C does not include a region on the inner side of case wall portion 3A, thereby providing more secure fixing of case 3 to base plate 1.

Power semiconductor element 5 is disposed over base plate 1 in case 3, that is, in a region surrounded by case 3. Specifically, power semiconductor element 5 is disposed in the container-shaped member formed of base plate 1 and case 3. Power semiconductor element 5 is mourned on a power semiconductor substrate 8.

Power semiconductor substrate 8 is mounted on one main surface 1A of base plate 1 in the aforementioned container-shaped member. Power semiconductor substrate 8 includes an insulating substrate 10, and wiring patterns 11, 12, 13. Insulating substrate 10 is a member in the shape of a rectangular flat plate in plan view, for example, and has one main surface 10A and the other opposite main surface 10B. Wiring pattern 11 and wiring pattern 12 are placed at a distance from each other on one main surface 10A which is the upper main surface in FIG. 1 of the pair of main surfaces of insulating substrate 10. Wiring pattern 13 is placed on the other main surface 10B which is the lower main surface of insulating substrate 10. It is preferable that insulating substrate 10 be made of an insulating material such as ceramic, and wiring patterns 11, 12, 13 be made of a metal material such as copper. Wiring patterns 11, 12, 13 are joined to main surfaces 10A, 10B of insulating substrate 10 directly (without a connecting member such as solder interposed therebetween).

Power semiconductor element 5 is placed on the upper main surface in FIG. 1 of wiring pattern 11, for example, of power semiconductor substrate 8. Power semiconductor element 5 has a power semiconductor element such as an IGBT, a MOSFET, or a FWDi incorporated therein. It is preferable that a chip forming power semiconductor element 5 be made of silicon carbide, for example.

In order to simplify the drawing, FIG. 1 illustrates only one power semiconductor element 5. Actually, however, as shown in an exploded perspective view of FIG. 2, it is preferable that a plurality of power semiconductor elements 5 be placed at a distance from one another with regard to a direction along one main surface 10A of insulating substrate 10. Thus, power semiconductor elements 5 are not limited to be placed on the upper main surface of wiring pattern 11 of power semiconductor substrate 8, but may also be placed on the upper main surface of wiring pattern 12.

Control semiconductor element 6 is disposed in case 3, that is, in the region surrounded by case 3. Specifically, as with power semiconductor element 5, control semiconductor element 6 is disposed in the container-shaped member formed of base plate 1 and case 3. Control semiconductor element 6 is mounted on a control circuit board 9.

Control circuit board 9 is a member in the shape of a rectangular flat plate in plan view, for example, and is a printed circuit board having one main surface 9A and the other opposite main surface 9B. Control semiconductor element 6 is placed in contact with one main surface 9A of control circuit board 9. Control semiconductor element 6 is a semiconductor element provided so as to drive and protect power semiconductor element 5. Although not shown, a peripheral circuit and the like are also mounted on one main surface 9A of control circuit board 9.

It is preferable that control circuit board 9 and control semiconductor element 6 mounted thereon be disposed, at a distance in the vertical direction of FIG. 1 from power semiconductor substrate 8 and power semiconductor element 5 mounted thereon, across power semiconductor substrate 8 from base plate 1, that is, on the upper side in FIG. 1.

Figure 2:
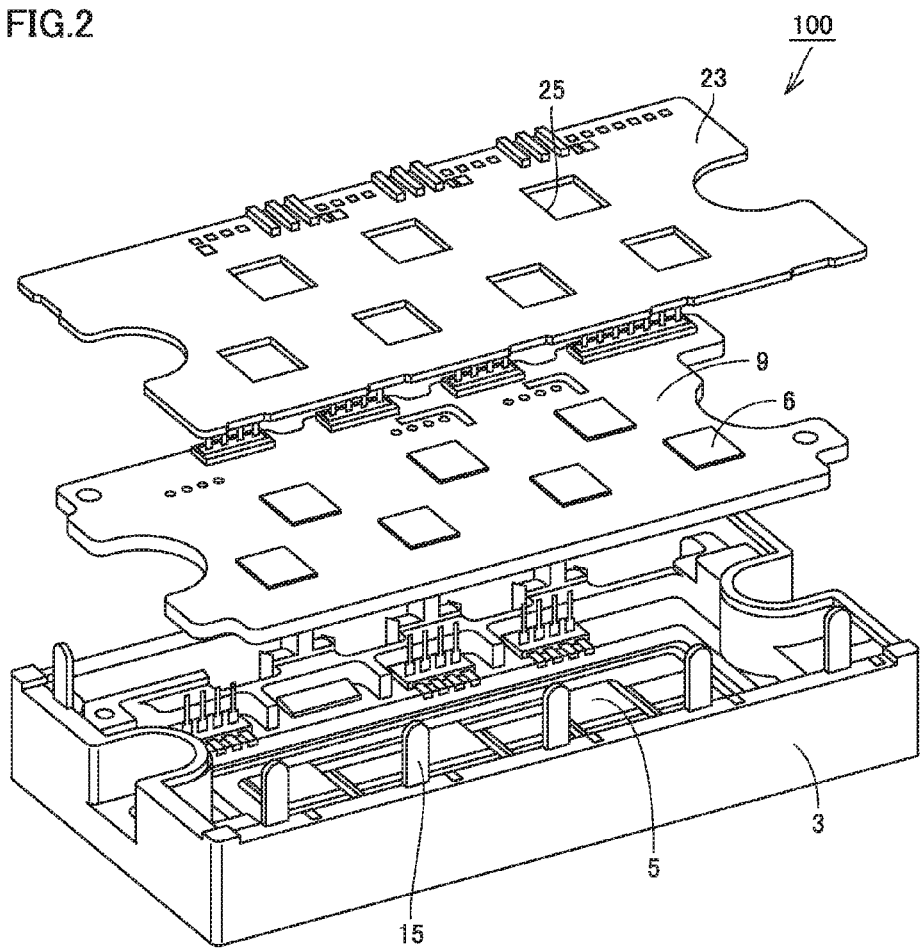
FIG. 2 is an exploded perspective view to illustrate the arrangement of members forming the semiconductor device of FIG. 1.

In order to simplify the drawing, FIG. 1 illustrates only one control semiconductor element 6. Actually, however, as shown in the exploded perspective view of FIG. 2, it is preferable that a plurality of control semiconductor elements 6 be placed at a distance from one another with regard to the direction along one main surface 10A of insulating substrate 10. As shown in FIG. 2, in this case, control semiconductor elements 6 are aligned in two rows, a front row and a back row of the figure in plan view, for example. One control semiconductor element 6 in the front row is placed in a position corresponding to a position midway between a pair of control semiconductor elements 6 adjacent to each other with regard to the horizontal direction of FIG. 2 (longitudinal direction in plan view) the back row. To put it conversely, one control semiconductor element 6 in the back row is placed in a position corresponding to a position midway between a pair of control semiconductor elements 6 adjacent to each other with regard to the horizontal direction of FIG. 2 in the front row. Control semiconductor elements 6 may be disposed in alternate positions (staggered positions) between the front row and the back row of FIG. 2 in this manner.

It is preferable that control circuit board 9 be made of a resin material such as glass epoxy. Control circuit board 9 is larger in size than power semiconductor substrate 8 in plan view. This is because power semiconductor substrate 8 is placed directly on one main surface 1A of base plate 1, and case 3 extends more inward at case lower surface 3C in relation to the other regions, causing the planar area of a region where power semiconductor substrate 8 can be disposed to be smaller than the planar area of a region where control circuit board 9 can be disposed. However, this configuration is not limiting, and control circuit board 9 may be smaller than power semiconductor substrate 8.

In FIG. 1, control circuit board 9 has a size occupying the entire region surrounded by case 3 in plan view, with control circuit board 9 being in contact with case wall portion 3A of case 3. However, this configuration is not limiting, and there may be space between case wall portion 3A and an outer edge of control circuit board 9.

Case 3 has an opening 21 formed therein opposite to base plate 1, that is, in an upper region in FIG. 1. The members such as power semiconductor element 5 and control semiconductor element 6 can be inserted through this opening 21 into the container-shaped member including case 3.

A cover 23 is disposed so as to close opening 21 in the top of case 3 described above. It is preferable that cover 23 be made of an insulating material such as resin. Cover 23 is disposed at the top of the entire semiconductor device 100 so as to face base plate 1. In FIG. 1, cover 23 is configured to close opening 21 by making contact with an inner wall of case wall portion 3A at an outer edge surface of cover 23. Alternatively, cover 23 may be configured to close opening 21 by covering case upper surface 3B.

Cover 23 has a hole 25 formed therein, which extends from one main surface of cover 23 in a thickness direction to reach the other opposite main surface. Hole 25 is formed to include, when disposed to face base plate 1, at least a portion of a region overlapping control semiconductor element 6 in plan view. It is more preferable that hole 25 be formed to overlap the entire control semiconductor element 6 in plan view.

Since hole 25 is formed in the region overlapping control semiconductor element 6, it is preferable that a plurality of holes 25 be formed if a plurality of control semiconductor elements 6 are formed, as shown in FIG. 2. Thus, although FIG. 1 illustrates only one hole 25 in order to simplify the drawing, a plurality of holes 25 are actually formed as shown in FIG. 2.

Accordingly, holes 25 may be disposed in alternate positions (staggered positions) between the front row and the back row of FIG. 2, as with control semiconductor elements 6. Moreover, being formed to overlap control semiconductor element 6, hole 25 more preferably has the same planar shape as control semiconductor element 6, and has, for example, the same rectangular planar shape as control semiconductor element 6. However, the planar shape of hole 25 is not limited as such, and may be a circular shape.

The aforementioned members are connected and sealed as will be described below. First, case 3 shown in FIG. 1 may have a main electrode terminal 15 formed on its inner surface. Main electrode terminal 15 may be configured to continue from the top surface of a region extending more inward in relation to case wall portion 3A as with case lower surface 3C, through the inner surface of case wall portion 3A, to reach case upper surface 3B. It is preferable that main electrode terminal 15 be made of a thin film of a metal material such as copper.

Power semiconductor substrate 8 is joined to one main surface 1A of base plate 1 by solder 31, for example. That is, wiring pattern 13 disposed on the other main surface 10B of power semiconductor substrate 8 is joined to base plate 1 by solder 31. Power semiconductor element 5 mounted on power semiconductor substrate 8 is joined to the surface of wiring pattern 11 by solder 31, for example.

Power semiconductor element 5 in chip form is joined to power semiconductor substrate 8 by solder 31, whereas control semiconductor element 6 is configured in a different manner. Referring to FIG. 3, control semiconductor element 6 includes a package 61 and a lead frame 62.

Package 61 houses therein a member made of silicon, for example, serving as a chip forming the control semiconductor element. If control semiconductor element 6 is of surface mount type, for example, it is preferable that package 61 be in the shape of a flat plate expanding in a direction along one main surface 9A of control circuit board 9 on which package 61 is mounted. Package 61 may have any internal configuration. Lead frame 62 is electrically connected to the aforementioned chip in package 61, and allows input/output of an electrical signal to/from the outside of control semiconductor element 6. It is preferable that package 61 be made of a resin material and lead frame 62 be made of a metal material such as copper.

Control semiconductor element 6 having the configuration shown in FIG. 3 is placed on one main surface 9A of control circuit board 9, with a tip portion of lead frame 62 being electrically connected by solder or the like to a terminal and the like on one main surface 9A of control circuit board 9. Control semiconductor element 6 is thus mounted on control circuit board 9.

A control signal terminal 32 is connected to control circuit board 9, and a control signal terminal 33 is connected to a region along case lower surface 3C, for example, which is part of case 3. Control signal terminal 32 for control circuit board 9 is a terminal for allowing input/output of an electrical signal between control semiconductor element 6 and the outside of semiconductor device 100. Thus, control signal terminal 32 is disposed so as to extend to a level above cover 23 to thereby reach the outside of semiconductor device 100. Control signal terminal 33 is a terminal provided to control power semiconductor element 5. It is preferable that control signal terminals 32, 33 be made of a metal material such as copper.

A terminal and the like (not shown) provided on power semiconductor element 5 are electrically connected to control signal terminal 33 by a bonding wire 34. Bonding wire 34 is a thin wire member made of a metal material such as aluminum. Bonding wire 34 may also be used to electrically connect power semiconductor element 5 to wiring pattern 12, or to electrically connect wiring pattern 12 to main electrode terminal 15, for example.

The inside of the container-shaped member formed of base plate 1 and case 3 is filled with a resin material 35. Resin material 35 is particularly disposed so as to fill only a region below control circuit board 9 in FIG. 1 of the inside of the container-shaped member. That is, resin material 35 is disposed so as to cover the surfaces of power semiconductor substrate 8 and power semiconductor element 5, a portion of the inner surface of case wall portion 3A, a portion of the surface of main electrode terminal 15, and the like. Thus, resin material 35 is disposed so as not to cover the surface of control semiconductor element 6. With hole 25 in cover 23 being disposed immediately above control semiconductor element 6, the surface of control semiconductor element 6 is configured to be open to the atmosphere, for example, as with the outer side of semiconductor device 100.

Resin material 35 is silicone gel or epoxy resin, and is preferably disposed so as to seal the region between control circuit board 9 and base plate 1, that is, the region below control circuit board 9 in FIG. 1, which includes power semiconductor element 5, power semiconductor substrate 8 and the like as described above.

The function and effect of this embodiment will now be described with reference to a comparative example of this embodiment.

Referring to FIGS. 4 and 5, a semiconductor device 900 of the comparative example basically has a similar configuration to that of semiconductor device 100 of this embodiment. Accordingly, the same components of semiconductor device 900 as those of semiconductor device 100 are designated by the same reference signs, and the descriptions thereof will not be repeated. Semiconductor device 900 is different from semiconductor device 100 in that hole 25 is not formed in cover 23.

An intelligent power module including power semiconductor element 5 of silicon is usually used in a low frequency domain of not more than about 20 kHz in consideration of increase in joint temperature of the power semiconductor element due to heat generation caused by switching loss. An intelligent power module including power semiconductor element 5 of silicon carbide, on the other hand, can operate at higher temperature than that of the intelligent power module including power semiconductor element 5 of silicon, can be used in a frequency domain of not less than 50 kHz and not more than 100 kHz, and can even operate in a high frequency domain of higher than 100 kHz.

The operation of an intelligent power module in a high frequency domain of not less than 50 kHz, however, involves a problem of increased amount of heat generated by control semiconductor element 6. That is, in semiconductor device 900, the user can cool semiconductor element 5 with base plate 1 interposed therebetween, whereas it is difficult for the user to cool control semiconductor element 6.

Accordingly, in semiconductor device 100 of this embodiment, hole 25 is formed in at least a portion of the region of cover 23 overlapping control semiconductor element 6 in plan view. This allows cooling of control semiconductor element 6 by utilizing the atmosphere from above cover 23, that is, from the outside of semiconductor device 100, thereby suppressing excessive temperature increase of control semiconductor element 6.

To further improve the cooling efficiency, it is more preferable for the user to provide a cooling device such as a fan on the upper surface of control semiconductor element 6. The user can provide such a cooling device owing to the provision of hole 25. This allows cooling of control semiconductor element 6 by air, thereby improving the effect of suppressing temperature increase of control semiconductor element 6. As such, in this embodiment, heat can be dissipated at high efficiency from not only power semiconductor element 5 but also control semiconductor element 6.

Second Embodiment

Figure 6:
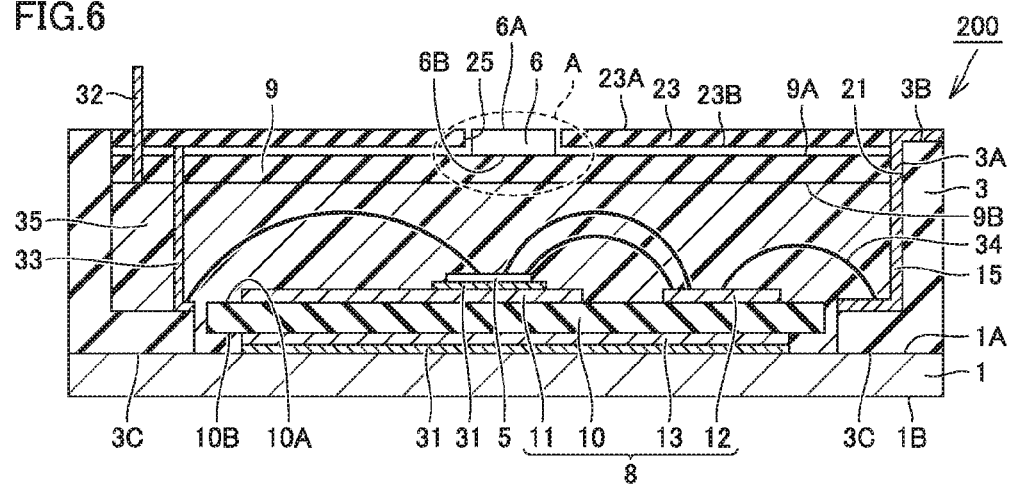
FIG. 6 is a schematic sectional view illustrating the configuration of a semiconductor device of a second embodiment.

Referring to FIG. 6, a semiconductor device 200 of this embodiment basically has a similar configuration to that of semiconductor device 100 of the first embodiment shown in FIG. 1. Accordingly, the same components of semiconductor device 200 of FIG. 6 as those of semiconductor device 100 of FIG. 1 are designated by the same reference signs, and the descriptions thereof will not be repeated. Semiconductor device 200 is different from semiconductor device 100 in the position of control semiconductor element 6 in the vertical direction of FIG. 6.

As described above, control semiconductor element 6 is configured to include package 61 and lead frame 62. One main surface 6A and the other opposite main surface 6B of control semiconductor element 6 are now considered. One main surface 6A is the upper main surface in FIG. 6 of the pair of main surfaces of the body of control semiconductor element 6 (for example, the body of package 61), while the other main surface 6B is the lower main surface in FIG. 6. Likewise, regarding cover 23, one upper main surface 23A and the other opposite main surface 23B in FIG. 6 are now considered.

Figure 7:
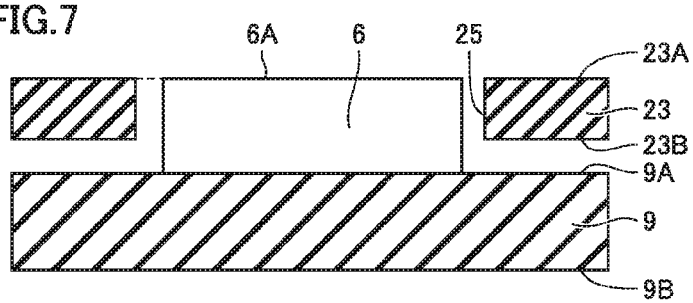
FIG. 7 is a schematic sectional view illustrating in detail a first example of a region A enclosed by a dotted line in FIG. 6.
Figure 8:
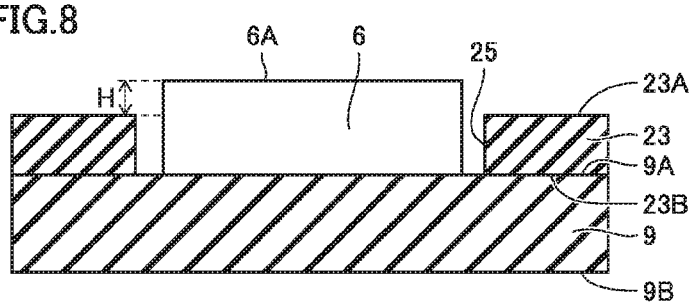
FIG. 8 is a schematic sectional view illustrating in detail a second example of region A enclosed by the dotted line in FIG. 6.

As shown in a region A enclosed by a dotted line in FIG. 6, in this embodiment, hole 25 in cover 23 overlaps the entire control semiconductor element 6 in plan view. Control semiconductor element 6 is disposed such that it is inserted in hole 25. Referring to FIG. 7, in region A of FIG. 6, one main surface 23A of cover 23 facing away from base plate 1 may be disposed in a position coplanar with one main surface 6A of control semiconductor element 6 facing away from base plate 1. Alternatively, referring to FIG. 8, in region A of FIG. 6, one main surface 23A of cover 23 facing away from base plate 1 may be disposed closer to base plate 1, that is, at a lower side of FIG. 6, than one main surface 6A of control semiconductor element 6 facing away from base plate 1. In the case of FIG. 8, one main surface 6A projects upward for a dimension H in relation to one main surface 23A.

In this embodiment, control semiconductor element 6 and control circuit board 9 are generally disposed in the upper portion of semiconductor device 200 than in the first embodiment. This causes the region below control circuit board 9, that is, the region filled with resin material 35, to have a greater depth in the vertical direction of FIG. 6 than in the first embodiment, so that almost the entire region in the container-shaped member formed of base plate 1 and case 3 is covered with resin material 35.

The function and effect of this embodiment will now be described. This embodiment provides the following function and effect in addition to the function and effect of the first embodiment.

In the first embodiment, the top surface of cover 23 is disposed higher than the top surface of control semiconductor element 6, and the top surface of control semiconductor element 6 is disposed in the container-shaped member formed of base plate 1 and case 3. It is thus difficult for the user to attach a cooling device to the top surface of control semiconductor element 6. However, by disposing the top surface of cover 23, that is, one main surface 23A, lower than the top surface of control semiconductor element 6, that is, one main surface 6A, as in this embodiment, one main surface 6A of control semiconductor element 6 is rendered more accessible to the user. Accordingly, the user can attach a cooling device such as a heat dissipation fin to one main surface 6A more readily than in the first embodiment. The effect of suppressing excessive temperature increase of control semiconductor element 6 can be improved by the attachment of this cooling device.

Third Embodiment

Figure 9:
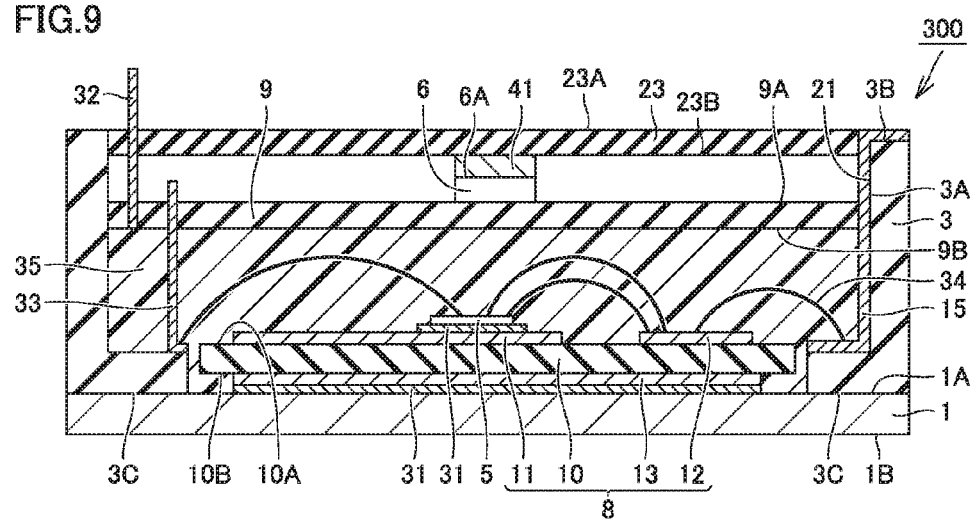
FIG. 9 is a schematic sectional view illustrating the configuration of a semiconductor device of a third embodiment.

Referring to FIG. 9, a semiconductor device 300 of this embodiment basically has a similar configuration to that of semiconductor device 100 of the first embodiment shown in FIG. 1. Accordingly, the same components of semiconductor device 300 of FIG. 9 as those of semiconductor device 100 of FIG. 1 are designated by the same reference signs, and the descriptions thereof will not be repeated. Semiconductor device 300 is different from semiconductor device 100 in that it further includes a heat sink 41 on one main surface 6A of control semiconductor element 6 facing away from base plate 1, where heat sink 41 is disposed so as to close hole 25 in cover 23 immediately above control semiconductor element 6.

It is preferable that heat sink 41 be made of a metal plate such as aluminum. It is also preferable that heat sink 41 be in contact with and cover the entire one main surface 6A of control semiconductor element 6. In FIG. 9, heat sink 41 and control semiconductor element 6 are equal in planar area. However, heat sink 41 may basically have any planar shape, and may have a size that partially extends off control semiconductor element 6 in plan view (that is, heat sink 41 may be larger than control semiconductor element 6).

Heat sink 41 is disposed such that its bottom surface is in contact with one main surface 6A of control semiconductor element 6, and its top surface closes an end portion of hole 25 closest to base plate 1 (lower side in FIG. 9) and is in contact with the other main surface 23B of cover 23 in a region adjacent to hole 25 in plan view. Thus, in semiconductor device 300, hole 25 is disposed only in a portion of a region overlapping heat sink 41 in plan view, and hole 25 is smaller than heat sink 41 in planar area. When heat sink 41 and control semiconductor element 6 are equal in planar area, it can also be said that hole 25 is disposed only in a portion of a region overlapping control semiconductor element 6 in plan view, and that hole 25 is smaller than control semiconductor element 6 in planar area. Accordingly, heat sink 41 closes the entire hole 25 to block circulation of the atmosphere and the like between the inside and outside of the container-shaped member formed of base plate 1 and case 3.

The function and effect of this embodiment will now be described. This embodiment provides the following function and effect in addition to the function and effect of the first embodiment.

In the first embodiment, by providing cover 23 with hole 25, the atmosphere and the like can circulate between the inside and outside of the container-shaped member formed of base plate 1 and case 3. While this improves efficiency of heat dissipation from control semiconductor element 6 to the outside, it is feared that a foreign substance mixed from the outside of semiconductor device 100 may adhere to one main surface 6A of control semiconductor element 6.

Thus, by providing heat sink 41 to cover one main surface 6A of control semiconductor element 6 and to close hole 25 in cover 23 as in this embodiment, the adhesion of a foreign substance to one main surface 6A of control semiconductor element 6 can be suppressed while the heat dissipation performance from control semiconductor element 6 to the outside of semiconductor device 100 is ensured.

Fourth Embodiment

Figure 10:
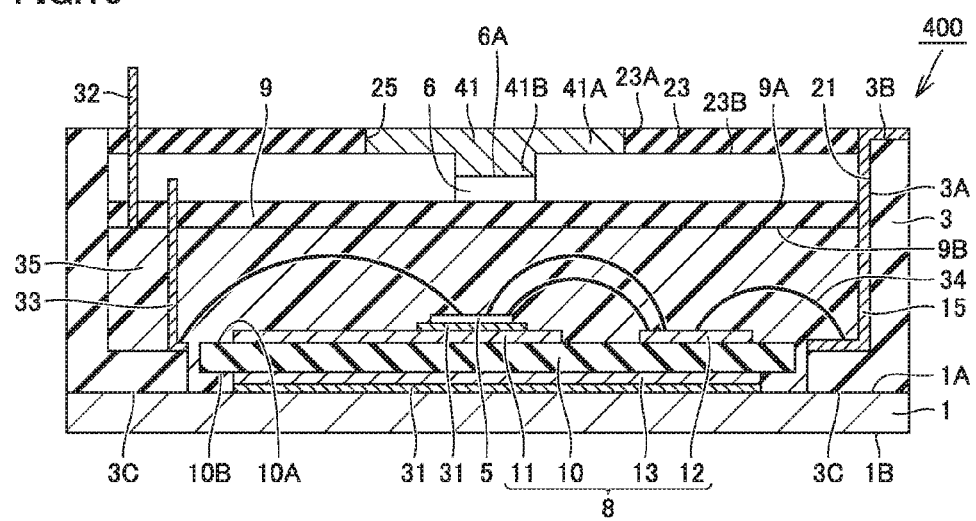
FIG. 10 is a schematic sectional view illustrating the configuration of a semiconductor device of a fourth embodiment.

Referring to FIG. 10, a semiconductor device 400 of this embodiment basically has a similar configuration to those of semiconductor device 100 of the first embodiment shown in FIG. 1 and semiconductor device 300 of the third embodiment shown in FIG. 9. Accordingly, the same components of semiconductor device 400 of FIG. 10 as those of semiconductor devices 100, 300 of FIGS. 1, 9 are designated by the same reference signs, and the descriptions thereof will not be repeated.

Semiconductor device 400 is different front semiconductor device 300 in that heat sink 41 includes a first heat sink portion 41A contained in hole 25 in cover 23, and a second heat sink portion 41B extending inward of case 3 from first heat sink portion 41A, that is, downward in FIG. 10. The bottom of second heat sink portion 41B is in contact with one main surface 6A of control semiconductor element 6, and particularly in FIG. 10, second heat sink portion 41B is in contact with the entire one main surface 6A. Thus, second heat sink portion 41B and one main surface 6A are equal in planar area. First heat sink portion 41A is disposed so as to cover an inner wall of hole 25 and to fill the entire hole 25.

In FIG. 10, hole 25 is larger than control semiconductor element 6 in planar area, and hole 25 is disposed so as to overlap the entire region overlapping control semiconductor element 6 in plan view, and also to overlap a region adjacent to an outer edge of control semiconductor element 6. Thus, first heat sink portion 41A filling the entire hole 25 so as to cover the inner wall of hole 25 is larger in planar area than second heat sink portion 41B in contact with control semiconductor element 6. However, as shown in FIG. 9, for example, again in this embodiment, hole 25 may be smaller than control semiconductor element 6 in planar area, and heat sink 41 having first heat sink portion 41A filling hole 25 and second heat sink portion 41B therebelow in contact with control semiconductor element 6 may be disposed.

The function and effect of this embodiment will now be described. This embodiment provides the following function and effect in addition to the function and effect of the third embodiment.

Again, in the configuration of the third embodiment where the heat generated by control semiconductor element 6 is dissipated to the outside of hole 25 by means of heat sink 41, it is more preferable for the user to provide a cooling device such as a fan on the upper surface of heat sink 41 in order to further improve the cooling efficiency. However, in the third embodiment, it is difficult to attach a cooling device such as a heat dissipation fin to the upper surface of heat sink 41 because the top surface of heat sink 41 is in a lower position than one main surface 23A of cover 23.

Thus, in semiconductor device 400 of this embodiment, heat sink 41 is configured to include both first heat sink portion 41A which is contained in hole 25, and second heat sink portion 41B therebelow which is in contact with control semiconductor element 6. As a result, the top surface of heat sink 41 is disposed in a higher position than in the third embodiment. Accordingly, the attachment of a cooling device such as a heat dissipation fin to the upper surface of heat sink 41 can be facilitated while the effect of heat sink 41 itself of dissipating heat generated by control semiconductor element 6 is ensured.

Although the top surface of first heat sink portion 41A of heat sink 41 is disposed in a position coplanar with one main surface 23A of cover 23 in FIG. 10, the top surface of first heat sink portion 41A may be configured to project to a level above one main surface 23A, that is, to the outside of semiconductor device 100. Such a configuration can also facilitate the attachment of a cooling device to heat sink 41, and because heat sink 41 is exposed to the outside of semiconductor device 100, can further improve the heat dissipation performance with respect to control semiconductor element 6.

Fifth Embodiment

Figure 11:
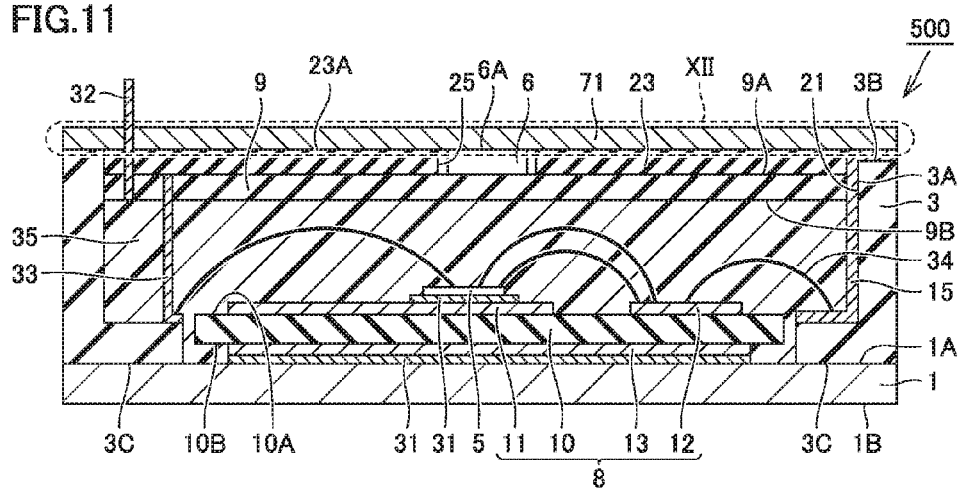
FIG. 11 is a schematic sectional view illustrating the configuration of a semiconductor device of a fifth embodiment.

Referring to FIG. 11, a semiconductor device 500 of this embodiment basically has a similar configuration to that of semiconductor device 200 of the second embodiment shown in FIG. 6. Accordingly, the same components of semiconductor device 500 of FIG. 11 as those of semiconductor device 200 of FIG. 6 are designated by the same reference signs, and the descriptions thereof will not be repeated. Semiconductor device 500 is different from semiconductor device 200 in that it further includes a Peltier element 71 above one main surface 23A of cover 23 facing away from base plate 1.

Figure 15:
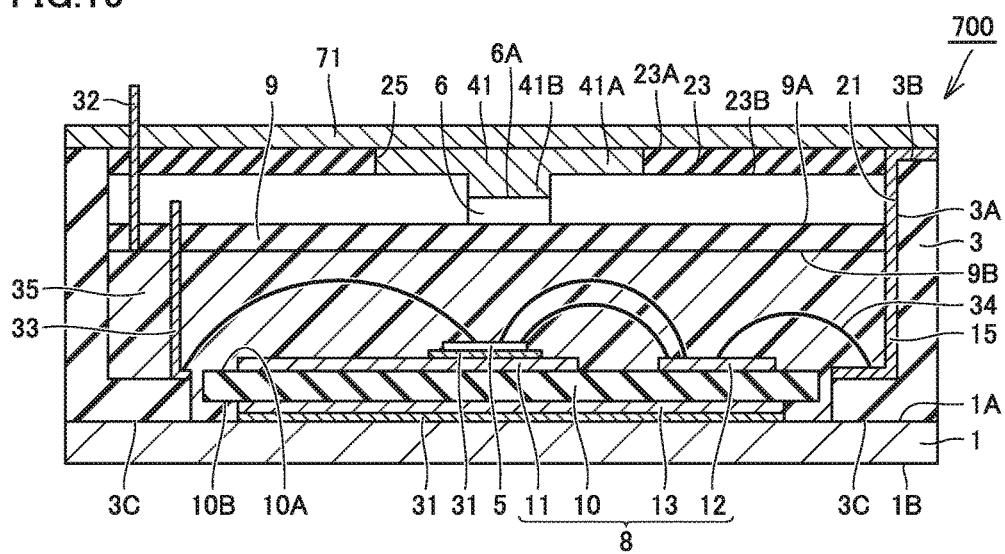
FIG. 15 is a schematic sectional view illustrating the configuration of a semiconductor device including a Peltier element.

Peltier element 71 is disposed in FIG. 11 such that its bottom surface is in contact with one main surface 23A of cover 23 and one main surface 6A of control semiconductor element 6. However, this configuration is not limiting. When Peltier element 71 is applied to the configuration of the second embodiment shown in FIG. 8, for example, Peltier element 71 may be configured such that its bottom surface is in contact with one main surface 6A, but is floating above one main surface 234 without contacting one main surface 23A. Alternatively, when Peltier element 71 is applied to semiconductor device 400 of the fourth embodiment shown in FIG. 10, as is shown in FIG. 15, for example, with semiconductor device 700, Peltier element 71 may be configured such that its bottom surface is in contact with the top surface of heat sink 41 and one main surface 23A of cover 23.

A power supply for a control circuit of the intelligent power module, that is, a power supply for driving control semiconductor element 6 attached to control circuit board 9, is used as a power supply for Peltier element 71. Thus, there is no need to additionally provide a power supply for Peltier element 71.

Figure 12:
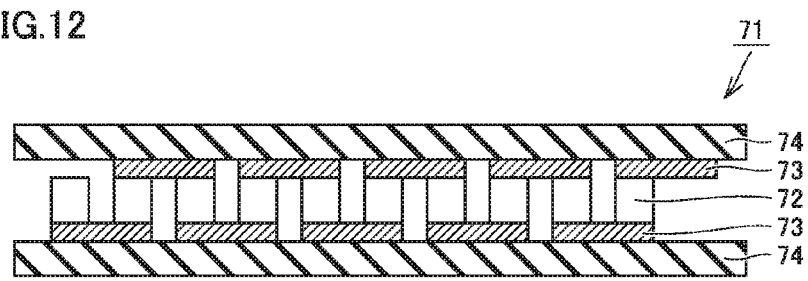
FIG. 12 is a schematic sectional view illustrating the configuration of a Peltier element.

Referring to FIG. 12, Peltier element 71 in a region XII enclosed by a dotted line in FIG. 11 includes a plurality of thermoelectric elements 72, a plurality of electrodes 73, and a pair of ceramic substrates 74. The plurality of thermoelectric elements 72 are composed of, for example, a combination of p type semiconductors and n type semiconductors of silicon. In this case, p type semiconductors and n type semiconductors are alternately aligned with regard to the horizontal direction of FIG. 12, for example.

The plurality of electrodes 73 are made of a metal material such as copper. The plurality of electrodes 73 are each connected to a pair of thermoelectric elements 72 adjacent to each other with regard to the horizontal direction of FIG. 12, and are alternately disposed in regions above and below thermoelectric elements 72 of FIG. 12. In other words, if a first thermoelectric element 72 and a second, adjacent thermoelectric element 72 are connected together by electrode 73 on the upper side of thermoelectric elements 72, then second thermoelectric element 72 and a third, adjacent thermoelectric element 72 opposite to first thermoelectric element 72 are connected together by electrode 73 on the lower side of thermoelectric elements 72.

In this manner, all of thermoelectric elements 72 and electrodes 73 are connected in an integrated manner. The pair of ceramic substrates 74 is disposed so as to sandwich all of the aforementioned integrated thermoelectric elements 72 and electrodes 73 from above and below.

The function and effect of this embodiment will now be described. This embodiment provides the following function and effect in addition to the function and effect of each of the embodiments described above.

In the semiconductor device of each of the embodiments described above, it is required for the user to provide a cooling device in order to further improve the cooling efficiency. In this embodiment, however, Peltier element 71 is provided above one main surface 23A of cover 23. Accordingly, control semiconductor element 6 can be cooled at high efficiency with the Peltier element interposed therebetween, without providing the aforementioned cooling device.

Sixth Embodiment

Figure 13:
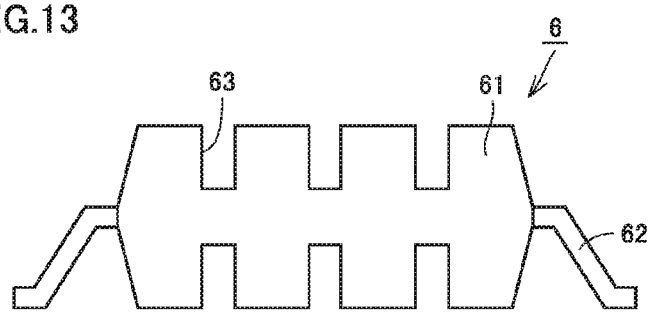
FIG. 13 is a schematic front view illustrating the configuration of a control semiconductor element disposed in region III enclosed by the dotted line in FIG. 1, in a sixth embodiment.

As discussed above, control semiconductor element 6 used in each embodiment includes package 61 and lead frame 62 (see FIG. 3). Referring to FIG. 13, in this embodiment, package 61 includes a plurality of recesses 63 having a depth of not less than 500 μm in at least a portion of the surface of package 61. These plurality of, namely, two or more, recesses 63 are formed in the surface of package 61 at a distance from one another. Recesses 63 are, in the surface of package 61, not less than 500 μm in depth, that is, in dimension in the vertical direction of FIG. 13, relative to a region other than the regions where recesses 63 are formed. This depth of recesses 63 is more preferably not less than 600 μm.

As shown in FIG. 13, two or more recesses 63 may be formed in both the top surface of package 61, that is, the surface facing away from base plate 1 during the mounting, and the bottom surface of package 61, that is, the surface facing base plate 1 during the mounting. Alternatively, two or more recesses 63 may be formed in only one of the top surface and the bottom surface of the package.

Control semiconductor element 6 having the feature of the surface of package 61 described above may be applied to any of semiconductor devices 100 to 500 of the embodiments described above. The semiconductor device of this embodiment basically has a similar configuration to those of semiconductor devices 100 to 500 of the first to fifth embodiments described above except for the surface of package 61 described above, and therefore the descriptions of their configuration features will not be repeated.

The function and effect of this embodiment will now be described. This embodiment provides the following function and effect in addition to the function and effect of each of the first to fifth embodiments described above.

By providing the surface of package 61 included in control semiconductor element 6 with recesses 63 having a depth of not less than 500 μm as described above, package 61 has a greater surface area than when recesses 63 are not formed. Accordingly, the heat dissipation performance from the surface of control semiconductor element 6 can be improved.

Seventh Embodiment

Figure 14:
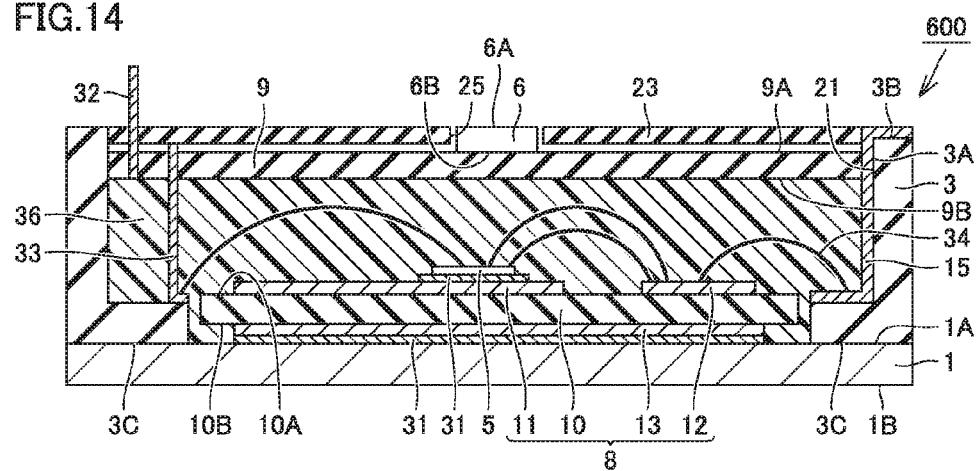
FIG. 14 is a schematic sectional view illustrating the configuration of a semiconductor device of a seventh embodiment.

Referring to FIG. 14, in a semiconductor device 600 of this embodiment, a highly heat dissipating resin 36 is disposed instead of resin material 35 in the container-shaped member formed of base plate 1 and case 3, particularly in a region below control circuit board 9. As with resin material 35 of FIG. 1 and the like, highly heat dissipating resin 36 is disposed so as to cover the surfaces of power semiconductor substrate 8 and power semiconductor element 5, the other main surface 9B of control circuit board 9, a portion of the inner surface of case wall portion 3A, a portion of the surface of main electrode terminal 15, and the like. In this manner, highly heat dissipating resin 36 fills case 3 so as to seal power semiconductor element 5.

As with resin material 35, highly heat dissipating resin 36 is made of resin such as silicone gel or epoxy resin. However, highly heat dissipating resin 36 has greater heat dissipation performance than resin material 35. Specifically, highly heat dissipating resin 36 has a thermal conductivity of not less than 0.5 W/(m·K). This thermal conductivity is more preferably not less than 0.6 W/(m·K).

FIG. 14 illustrates an example where highly heat dissipating resin 36 is applied to semiconductor device 200 of the second embodiment. However, this is not limiting, and highly heat dissipating resin 36 may be applied to any of semiconductor devices 100 to 500 of the embodiments described above. The semiconductor device of this embodiment basically has a similar configuration to those of semiconductor devices 100 to 500 of the embodiments described above except for the surface of package 61 described above, and therefore the descriptions of their configuration features will not be repeated.

The function and effect of this embodiment will now be described. This embodiment provides the following function and effect in addition to the function and effect of each of the first to sixth embodiments described above.

In each of the first to sixth embodiments described above, the performance of dissipation of heat transferred from control semiconductor element 6 and control circuit board 9 to resin material 35 may become an issue. In this embodiment, however, the heat transferred from control semiconductor element 6 and control circuit board 9 to highly heat dissipating resin 36 can be dissipated at high efficiency from base plate 1 to the outside of semiconductor device 600, for example. Accordingly, the heat dissipation performance from control semiconductor element 6 can be further improved as compared to each of the first to sixth embodiments described above.

The features described in (each example included in) each embodiment described above may be applied in appropriate combination unless they are technically inconsistent with one another.

Although the embodiments of the present invention have been described, it should be understood that the embodiments disclosed herein are illustrative and non-restrictive in every respect. The scope of the present invention is defined by the terms of the claims, and is intended to include any modifications in the scope and meaning equivalent to the terms of the claims.

What is claimed is:

1. A semiconductor device comprising:
a base plate;
a case provided on the base plate;
a power semiconductor element disposed over the base plate in the case;
a control semiconductor element disposed in the case; and
a heat sink on a main surface of the control semiconductor element facing away from the base plate,
the case having an opening formed therein opposite to the base plate,
the semiconductor device further comprising a cover to close the opening in the case,
the cover having a hole formed in at least a portion of a region overlapping the control semiconductor element in plan view,
the heat sink is disposed so as to close the hole in the cover,
the heat sink includes a first heat sink portion contained in the hole in the cover, and a second heat sink portion extending inward of the case from the first heat sink portion,
the second heat sink portion is in contact with the main surface of the control semiconductor element facing away from the base plate, and
the second heat sink portion is disposed outside the hole in the cover.

2. A semiconductor device comprising:
a base plate;
a case provided on the base plate;
a power semiconductor element disposed over the base plate in the case; and
a control semiconductor element disposed in the case,
the case having an opening formed therein opposite to the base plate,
the semiconductor device further comprising a cover to close the opening in the case,
the cover having a hole formed in at least a portion of a region overlapping the control semiconductor element in plan view,
wherein
the control semiconductor element includes a package, and
the package includes a plurality of recesses having a depth of not less than 500 μm in at least a portion of a surface of the package.

3. The semiconductor device according to claim 2, further comprising a highly heat dissipating resin filling the inside of the case so as to seal the power semiconductor element, the highly heat dissipating resin having a thermal conductivity of not less than 0.5 W/(m·K).

4. The semiconductor device according to claim 2, wherein
the hole overlaps the entire control semiconductor element in plan view,
the control semiconductor element is disposed in the hole, and
a main surface of the cover facing away from the base plate is disposed in a position coplanar with a main surface of the control semiconductor element facing away from the base plate, or in a position closer to the base plate than the main surface of the control semiconductor element facing away from the base plate.

5. The semiconductor device according to claim 2, further comprising a heat sink on a main surface of the control semiconductor element facing away from the base plate, wherein
the heat sink is disposed so as to close the hole in the cover.

6. The semiconductor device according to claim 5, wherein
the heat sink includes a first heat sink portion contained in the hole in the cover, and a second heat sink portion extending inward of the case from the first heat sink portion, and
the second heat sink portion is in contact with the main surface of the control semiconductor element facing away from the base plate.

7. The semiconductor device according to claim 1, further comprising a Peltier element above the main surface of the cover facing away from the base plate.

* * * * *